(12) United States Patent
Remple et al.

(10) Patent No.: US 9,899,922 B1
(45) Date of Patent: Feb. 20, 2018

(54) DIGITAL SUB-REGULATORS

(71) Applicant: QUALCOMM Incorporated, San Diego, CA (US)

(72) Inventors: Terrence Brian Remple, San Diego, CA (US); Sassan Shahrokhinia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/431,243

(22) Filed: Feb. 13, 2017

(51) Int. Cl.
G06F 1/32 (2006.01)
H02M 3/158 (2006.01)
H03K 19/00 (2006.01)
H02M 3/157 (2006.01)
G06F 13/40 (2006.01)

(52) U.S. Cl.
CPC .......... H02M 3/158 (2013.01); G06F 1/3296 (2013.01); G06F 13/4022 (2013.01); H02M 3/157 (2013.01); H03K 19/0005 (2013.01)

(58) Field of Classification Search
CPC ..... G05F 3/02; G05F 3/30; G05F 3/22; G05F 3/222; G05F 3/242; G05F 3/225; G05F 3/245; G05F 3/20; G05F 3/00; G05F 3/08; G05F 3/10; G05F 3/16; G05F 3/18; G05F 3/185; G05F 3/227; G05F 3/247; G05F 3/26; G05F 3/265; G05F 3/24; G05F 3/262; G05F 1/10; G05F 1/267; G05F 1/46; G05F 1/561; G05F 1/567; G05F 1/569; G05F 1/571; G05F 1/573; G05F 1/5735; G05F 1/461; G05F 1/462; H02M 3/157; H02M 3/158
See application file for complete search history.

(56) References Cited

U.S. PATENT DOCUMENTS

| | | |
|---|---|---|
| 5,969,514 A | 10/1999 | Merrill |
| 8,441,241 B2 | 5/2013 | Krishnamurthy et al. |
| 2010/0207797 A1* | 8/2010 | Bien .................. H03M 1/0604 341/155 |
| 2013/0049723 A1* | 2/2013 | Latham, II ............ H02M 3/157 323/282 |
| 2013/0249616 A1* | 9/2013 | Priel .............. H03K 19/018507 327/319 |
| 2014/0223205 A1 | 8/2014 | Muthukaruppan et al. |
| 2015/0177823 A1 | 6/2015 | Maiyuran et al. |
| 2016/0246342 A1 | 8/2016 | Muthukaruppan et al. |

* cited by examiner

*Primary Examiner* — Timothy J Dole
*Assistant Examiner* — Bryan R Perez
(74) *Attorney, Agent, or Firm* — Loza & Loza, LLP/Qualcomm

(57) ABSTRACT

In certain aspects, a regulator includes a variable-impedance switch coupled between a supply rail and a circuit block, wherein an impedance of the variable-impedance switch is set by an impedance code input to the variable-impedance switch. The regulator also includes an analog-to-digital converter (ADC) configured to convert a block supply voltage at the circuit block into a voltage code, and a controller configured to adjust the impedance code based on the voltage code in a direction that reduces a difference between the block supply voltage and a target supply voltage.

19 Claims, 13 Drawing Sheets

| vblk_code | Adjustment Value |
|---|---|
| 1111111 | -4 |
| 0111111 | -2 |
| 0011111 | +2 |
| 0001111 | +8 |
| 0000111 | +16 |
| 0000011 | +32 |
| 0000001 | +64 |
| 0000000 | +128 |

FIG. 6

DIGITAL SUB-REGULATORS

BACKGROUND

Field

Aspects of the present disclosure relate generally to regulators, and more particularly to digital sub-regulators.

Background

It is common for multiple circuit blocks (e.g., processors) on a chip to receive power from a common supply rail, in which each circuit block is coupled to the supply rail via a respective head switch. When a circuit block is active, the respective head switch is turned on, providing a low impedance path between the supply rail and the block. In this case, the voltage at the block is approximately equal to the supply voltage on the supply rail. When a circuit block is inactive, the respective head switch may be turned off to conserve power.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a regulator. The regulator includes a variable-impedance switch coupled between a supply rail and a circuit block, wherein an impedance of the variable-impedance switch is set by an impedance code input to the variable-impedance switch. The regulator also includes an analog-to-digital converter (ADC) configured to convert a block supply voltage at the circuit block into a voltage code, and a controller configured to adjust the impedance code based on the voltage code in a direction that reduces a difference between the block supply voltage and a target supply voltage.

A second aspect relates to a method for adjusting an impedance of a variable-impedance switch. The variable-impedance switch is coupled between a supply rail and a circuit block, and an impedance of the variable-impedance switch is set by an impedance code input to the variable-impedance switch. The method includes converting a block supply voltage at the circuit block into a voltage code, and adjusting the impedance code based on the voltage code in a direction that reduces a difference between the block supply voltage and a target supply voltage.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 6 shows an exemplary table mapping different values of the digital voltage code to respective adjustment values according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A processor in a System on a Chip (SoC) often performs multiple tasks in sequence, in which the processing requirements of the tasks may vary. When the processor performs a task with a low processing requirement, the clock speed of the processor may be reduced to save power. When the processor performs a task with a high processing requirement, the clock speed may need to be increased in order to perform the task. Thus, the clock speed of the processor may vary according to the processing requirements of the tasks being performed by the processor.

When the clock speed is low, the supply voltage of the processor may be reduced to further reduce power. This is because the low clock speed allows transistors in the processor to operate at lower switching speeds, and therefore a lower supply voltage. When the clock speed is high, the voltage supply needs to be increased to increase the switching speeds of the transistors. In this regard, the supply voltage of the processor may be dynamically scaled (adjusted) according to the clock speed of the processor in a technique referred to as Dynamic Clock and Voltage Scaling (DCVS). This technique may also be referred as Dynamic Voltage and Frequency Scaling (DVFS).

The benefit of DCVS may be diminished when multiple processors share the same supply rail. This is because the supply voltage on the supply rail needs to be set high enough to support the processor with the highest clock speed. As a result, the supply voltage is higher than needed for processors with lower clock speeds, resulting in wasted power.

Figure 1:
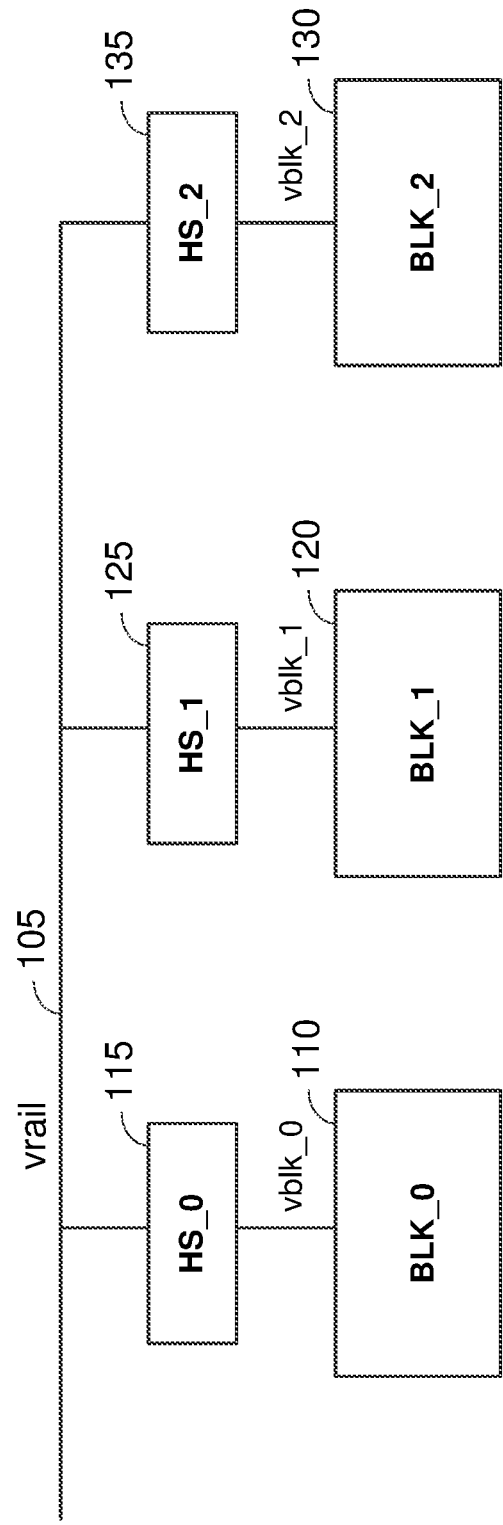
FIG. 1 shows an example of multiple circuit blocks sharing a common supply rail via multiple head switches according to certain aspects of the present disclosure.

FIG. 1 below shows an example of multiple circuit blocks 110, 120 and 130 (e.g., multiple processors) sharing a common supply rail 105. In this example, the circuit blocks 110, 120 and 130 (e.g., processors) are coupled to the supply rail 105 through head switches (HS) 115, 125 and 135, respectively. When a circuit block is active, the respective head switch is turned on, providing a low impedance (e.g., several milliohms) path between the supply rail 105 and the block. In this case, the voltage at the block is approximately equal to the supply voltage on the supply rail 105. When a circuit block is inactive, the respective head switch may be turned off to conserve power.

Assuming all the circuit blocks 110, 120 and 130 are active, if block 110 has a higher clock speed than blocks 120 and 130, then the supply voltage on the supply rail 105 is set high enough (e.g., by a power management integrated circuit (PMIC)) to support the clock speed of block 110. As a result, the supply voltage on the supply rail 105 is higher than needed for blocks 120 and 130, which operate at lower clock speeds than block 110. This results in wasted power.

Therefore, in the above approach, the supply voltage of all of the blocks is dictated by the block with the highest clock speed (e.g., block 110), resulting in wasted power for blocks operating at lower clock speeds (e.g., blocks 120 and 130).

Aspects of the present disclosure address the above problem by replacing the head switches 115, 125 and 135 in FIG. 1 with digital sub-regulators (DSRs). The DSRs allow the supply voltage of each block to be independently set to a voltage below the supply voltage on the supply rail. Thus, if the supply voltage on the supply rail is set according to the block with the highest clock speed, then the supply voltage for each block operating at a lower clock speed can be set to a voltage below the supply voltage on the supply rail by the respective DSR. This reduces power consumption, as discussed further below.

Figure 2:
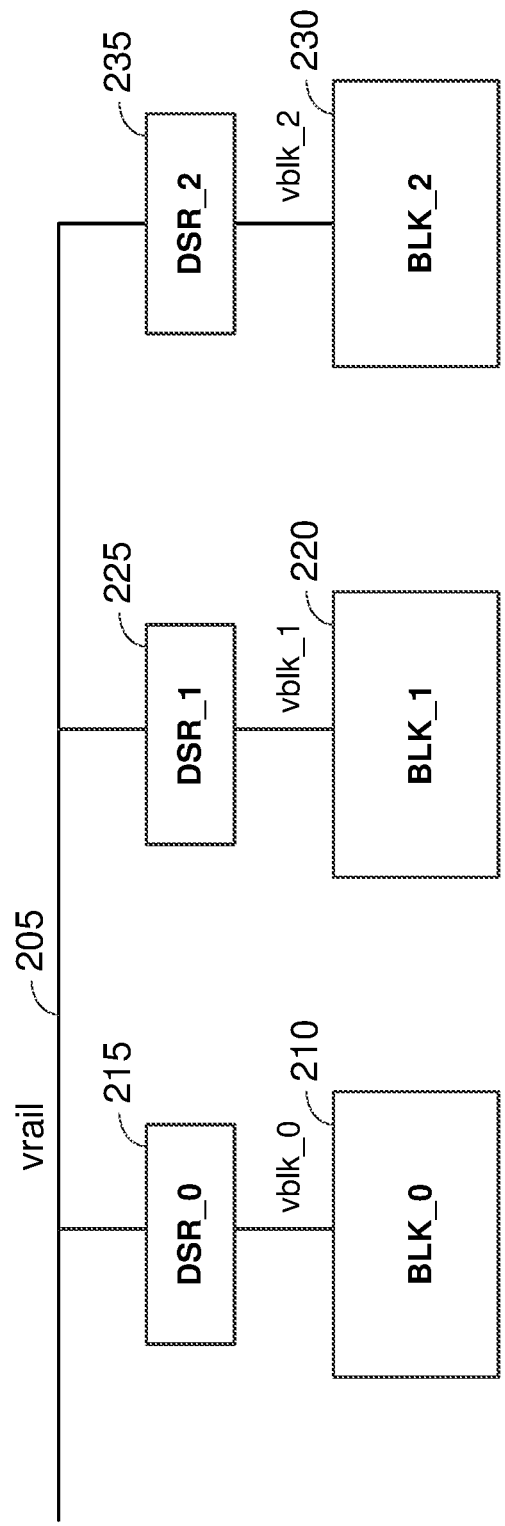
FIG. 2 shows an example of multiple circuit blocks sharing a common supply rail via multiple digital sub-regulators according to certain aspects of the present disclosure.

FIG. 2 below shows an example of multiple circuit blocks 210, 220 and 230 (e.g., processors) sharing a common supply rail 205. In this example, the circuit blocks 210, 220 and 230 (e.g., processor) are coupled to the supply rail 205 through digital sub-regulators (DSRs) 215, 225 and 235, respectively. Each DSR allows the supply voltage of the respective block to be independently set to a supply voltage below the supply voltage (denoted "vrail") on the supply rail 205.

For example, if block 210 has the highest clock speed, then the supply voltage vrail on the supply rail 205 may be set high enough (e.g., by a PMIC) to support the clock speed of block 210. If each of blocks 220 and 230 operates at a lower clock speed than block 210, then the supply voltages of blocks 220 and 230 (denoted "vblk_1" and "vblk_2") may be set lower than the supply voltage vrail by the respective DSRs 225 and 235. Thus, the supply voltages of blocks 220 and 230 are no longer dictated by the block with the highest clock speed (i.e., block 210 in this example).

The reduced supply voltages of blocks 220 and 230 reduce the amount of energy consumed by these blocks. The amount of energy saved per clock cycle at each of blocks 220 and 230 may be proportional to the difference between the supply voltage vrail on the supply rail 205 and the supply voltage at the block.

Figure 3:
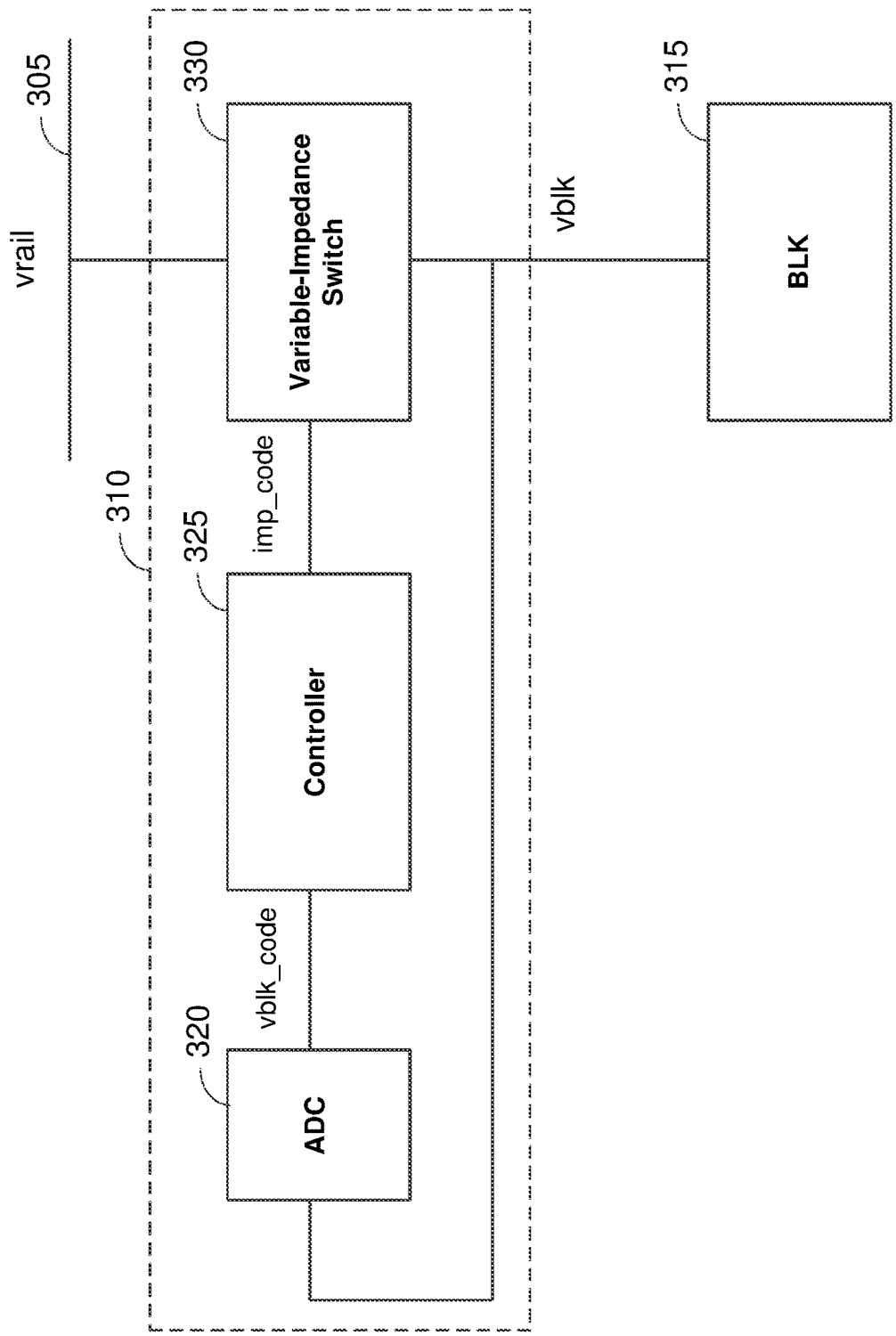
FIG. 3 shows an example of a digital sub-regulator according to certain aspects of the present disclosure.

FIG. 3 shows an exemplary implementation of a DSR 310 according to some embodiments of the present disclosure. The DSR 310 may be used to implement each of the DSRs 215, 225 and 235 shown in FIG. 2. In other words, each of the DSR 215, 225 and 235 in FIG. 2 may be a separate instance (copy) of the DSR 310 shown in FIG. 3.

The DSR 310 is coupled between a supply rail 305 and a respective circuit block 315 (e.g., processor). For example, if the DSR 310 is used to implement DSR 225 in FIG. 2, then the supply rail 305 corresponds to supply rail 205 in FIG. 2 and circuit block 315 corresponds to circuit block 220 in FIG. 2.

The DSR 310 includes an analog-to-digital converter (ADC) 320, a controller 325, and a variable-impedance switch 330. The variable-impedance switch 330 is coupled between the supply rail 305 and the respective circuit block 315. The variable-impedance switch 330 has an adjustable (tunable) impedance that is set by a digital impedance code (denoted "imp_code" in FIG. 3). Since the variable-impedance switch 330 is coupled between the supply rail 305 and the respective circuit block 315, the variable-impedance switch 330 allows the impedance between the supply rail 305 and the respective circuit block 315 to be adjusted by adjusting the impedance code imp_code.

In one example, the variable-impedance switch 330 includes multiple pass field effect transistors (FETs) coupled in parallel between the supply rail 305 and the respective circuit block 315. In this example, the impedance of the variable-impedance switch 330 is adjusted by adjusting the number of pass FETs that are turned on. The larger the number of pass FETs that are turned on, the lower the impedance between the supply rail 305 and the respective block 315, and hence the higher the supply voltage vblk at the respective block for a given load current. In the discussion below, the supply voltage vblk at the respective circuit block 315 is referred to as the block supply voltage vblk.

The ADC 320 is configured to convert the block supply voltage vblk into a digital voltage code (denoted "vblk_code"), and input the digital voltage code vblk_code to the controller 325. The digital voltage code vblk_code provides the controller 325 with a digital representation of the block supply voltage vblk. As discussed further below, the ADC 320 may be implemented with a flash ADC or another type of ADC.

The controller 325 is configured to adjust the impedance of the variable-impedance switch 330 based on the digital voltage vblk_code and a target supply voltage. The target supply voltage may correspond to a desired supply voltage for the respective circuit block 315. More particularly, the controller 325 adjusts the impedance of the variable-impedance switch 330 based on the voltage code blk_code and the target supply in a direction that reduces the difference between the block supply voltage vblk and the target supply voltage. For example, if the voltage code vblk_code indicates that the block supply voltage vblk is below the target supply voltage, then the controller 325 decreases the impedance of the variable-impedance switch 330 to raise (pull up) the block supply voltage vblk. If the voltage code vblk_code indicates that the block supply voltage vblk is above the target supply voltage, then the controller 325 increases the impedance of the variable-impedance switch 330 to reduce the block supply voltage vblk. In this example, the controller 325 adjusts the impedance of the variable-impedance switch 330 by adjusting (updating) the impedance code imp_code to the variable-impedance switch 330 accordingly.

Thus, the controller 325 adjusts the impedance of the variable-impedance switch 330 based on feedback of the block supply voltage vblk to reduce the difference between the block supply voltage vblk and the target supply voltage. In this way, the controller 325 maintains the block supply voltage vblk close to the target supply voltage over a range of load conditions at the circuit block 315.

Figure 4:
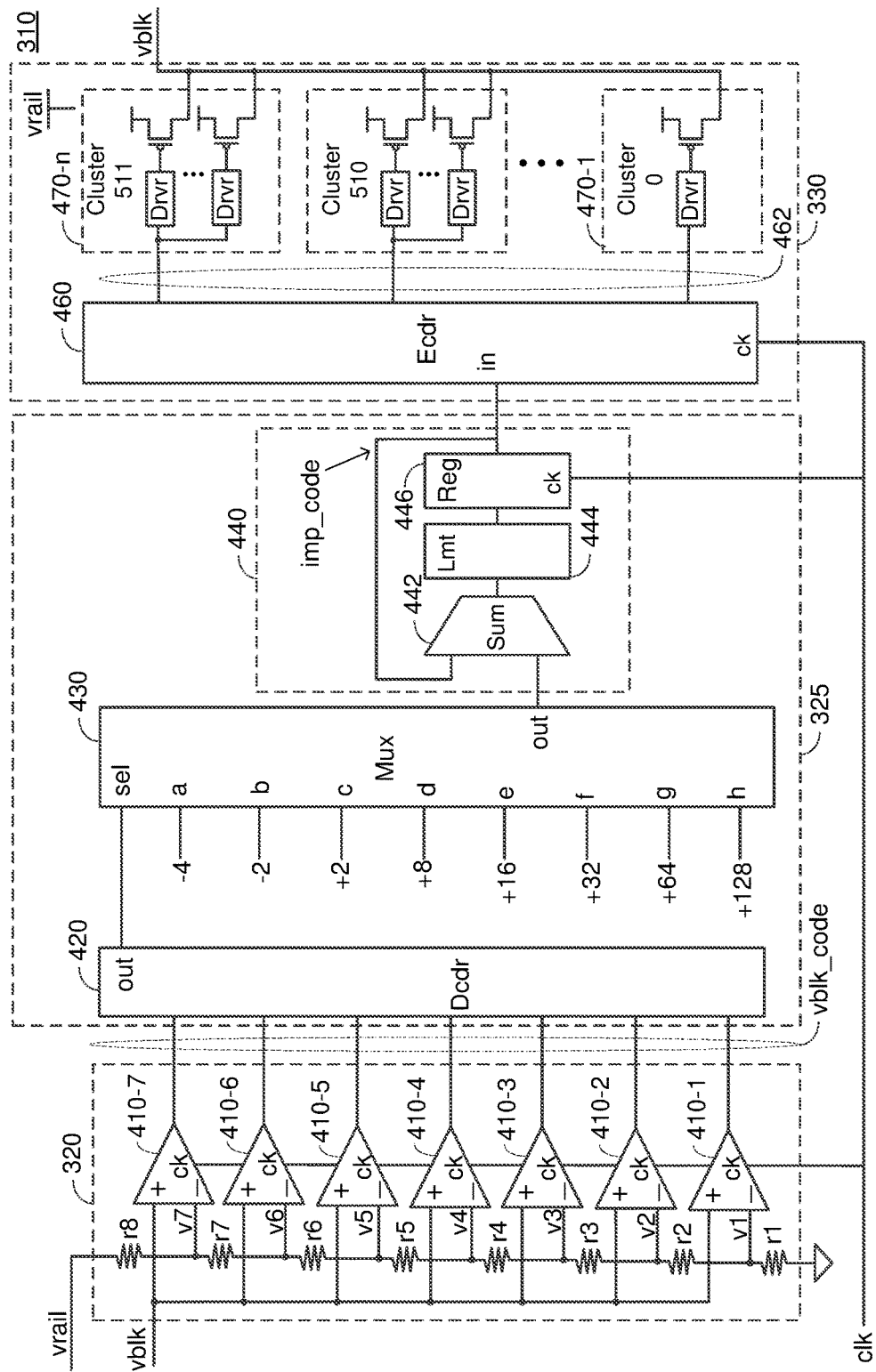
FIG. 4 shows an exemplary implementation of the digital sub-regulator according to certain aspects of the present disclosure.

FIG. 4 shows an exemplary implementation of the DSR 310 according to certain aspects of the present disclosure. The respective circuit block 315 is not shown in FIG. 4 for ease of illustration.

In this example, the variable-impedance switch 330 includes multiple clusters 470-1 to 470-n of pass field effect transistors (FETs). Each cluster may include one or more pass FETs coupled between the supply rail 305 and the respective circuit block 315, and a driver (labeled "Drvr") for each pass FET. In the example shown in FIG. 4, each pass FET is implemented with a P-channel FET (PFET), in which the respective driver drives the gate of the pass FET low to turn on the pass FET and drives the gate of the pass FET high to turn off the pass FET. In the example shown in FIG. 4, the variable-impedance switch 330 includes 512 clusters (labeled "cluster 0" to "cluster 511"), although it is to be appreciated that the variable-impedance switch 330 may include a different number of clusters.

The variable-impedance switch 330 also includes an encoder 460 configured to receive the impedance code imp_code from the controller 325, and to control the number of clusters that are turned based on the impedance code imp_code. For example, the impedance code imp_code may be a multibit value specifying the number of clusters that are to be turned on. In this example, the encoder 460 turns on the number of clusters specified by the impedance code imp_code. For instance, if the impedance code imp_code is 200, then the encoder 460 may turn on clusters 0 to 200 with the remaining clusters 211 to 511 turned off. The larger the value of the impedance code imp_code, the larger the number of clusters that are turned on, and therefore the lower the impedance of the variable-impedance switch 330. The smaller the value of the impedance code imp_code, the smaller the number of clusters that are turned on, and therefore the higher the impedance of the variable-impedance switch 330. Thus, in this example, the controller 325 decreases the impedance of the variable-impedance switch 330 by increasing the impedance code imp_code, and increases the impedance of the variable-impedance switch 330 by decreasing the impedance code imp_code.

In the example shown in FIG. 4, the encoder 460 has an input (labeled "in") that receives the impedance code imp_code from the controller 325. The encoder 460 also has multiple outputs 462 in which the number of outputs 462 is equal to the number of clusters and each one of the outputs 462 is coupled to a respective one of the clusters. In this example, the encoder 460 may turn on a particular cluster by outputting a logic one on the respective output and turn off the cluster by outputting a logic zero on the respective output. Thus, in this example, the encoder 460 converts the input impedance code imp_code into a thermometer code that is output on the outputs 462. Each bit of the thermometer code corresponds to a respective one of the clusters and the value of the bit controls whether the respective one of the clusters is turned on or off. For example, if the impedance code imp_code is 200, then the encoder 460 may output a logic one to each one of clusters 0 to 200 to turn on clusters 0 to 200 and output a logic zero to each one of the remaining clusters 211 to 511.

In the example in FIG. 4, the ADC 320 includes a voltage divider and multiple comparators 410-1 to 410-7. In this example, the voltage divider is implemented with a resistor ladder coupled between the supply rail 305 and ground, in which the resistor ladder includes multiple resistors r1 to r8 coupled in series. The resistor ladder generates a different reference voltage at each one of multiple nodes where each node is located between two adjacent resistors in the resistor ladder. In FIG. 4, the reference voltages generated by the resistor ladder are labeled v1 to v7, in which each reference voltage is a different fraction of the supply voltage vrail.

Each of the comparators 410-1 to 410-7 has a first input (−) coupled to a respective one of the reference voltages v1 to v7, and a second input (+) coupled to the block supply voltage vblk. Each comparator is configured to compare the respective reference voltage with the block supply voltage vblk, and output a logic one or zero based on the comparison. For example, each comparator may be configured to output a one if the block supply voltage vblk is equal to or greater than the respective reference voltage, and output a zero if the block supply voltage vblk is below the respective reference voltage. The outputs of the comparators 410-1 to 410-7 provide the voltage code vblk_code discussed above, which is a digital representation of the block supply voltage vblk.

Figure 5:
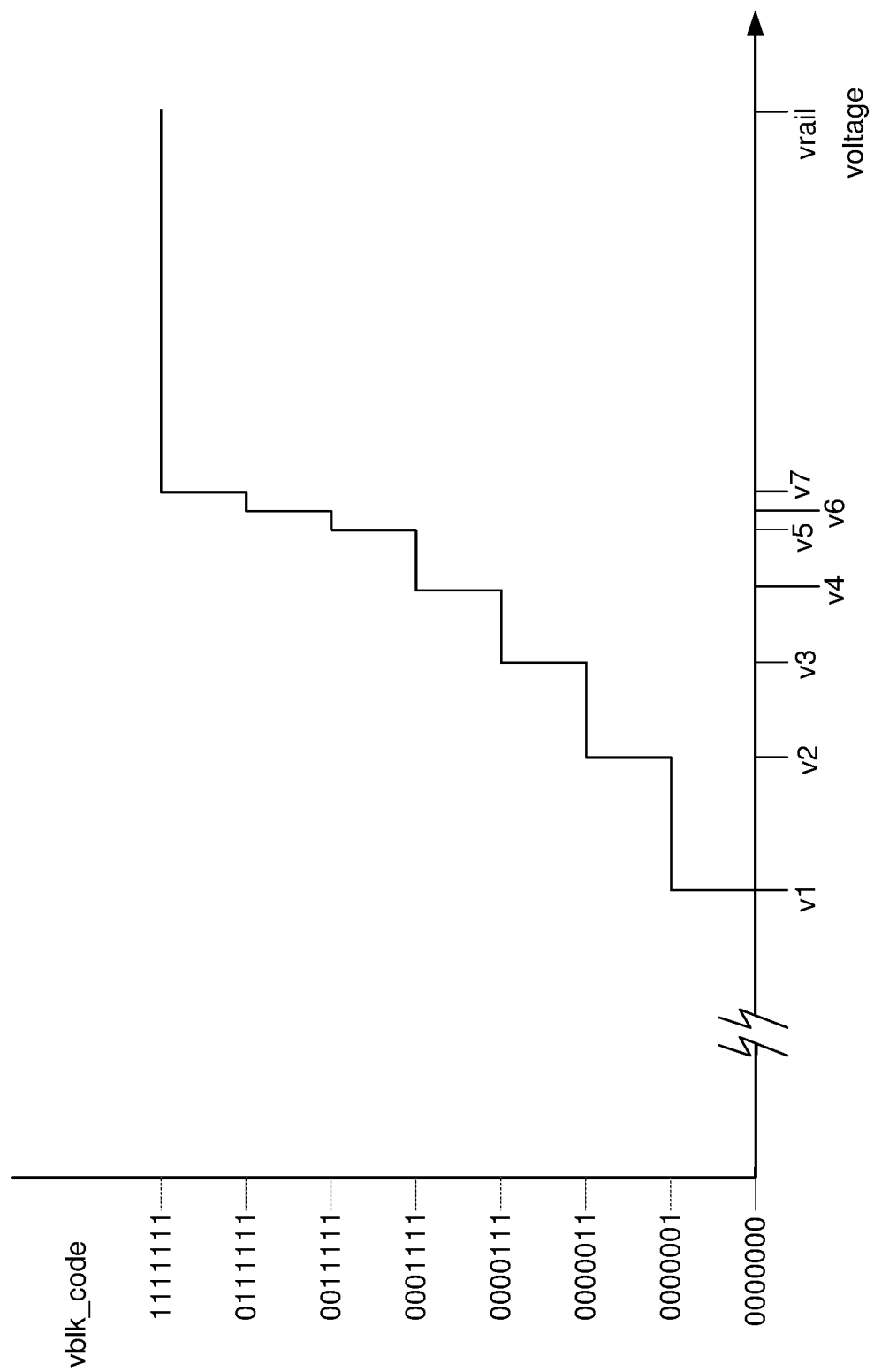
FIG. 5 is a plot illustrating an example of a digital voltage code as a function of a block supply voltage according to certain aspects of the present disclosure.

In this regard, FIG. 5 is a plot illustrating an example of the voltage code vblk_code as a function of the voltage level of the block supply voltage vblk. When the block supply voltage vblk is below the first reference voltage v1, all of the comparators 410-1 to 410-7 output zeros resulting in a voltage code vblk_code of "0000000". When the block supply voltage vblk is between the first reference voltage v1 and the second reference voltage v2, the first comparator 410-1 outputs a one and the remaining comparators output zeros resulting in a voltage code vblk_code of "0000001". When the block supply voltage vblk is between the second reference voltage v2 and the third reference voltage v3, the first and second comparators 410-1 and 410-2 output ones and the remaining comparators output zeros resulting in a voltage code vblk_code of "0000011", and so forth. When the block supply voltage vblk is above the seventh reference voltage v7, all of the comparators 410-1 to 410-7 output ones resulting in a voltage code vblk_code of "1111111". Thus, the ADC 320 converts the block supply voltage vblk into the voltage code vblk_code, in which the block supply voltage vblk is quantized to one of eight digital values in the example shown in FIG. 5.

In the example in FIG. 5, the reference voltages v1 to v7 are unevenly spaced. As discussed further below, this is done to provide higher resolution (i.e., smaller quantization steps) close to the target supply voltage.

It is to be appreciated that the ADC 320 is not limited to the example shown in FIG. 5. For example, the ADC 320 may include a different number of resistors in the resistor ladder and a different number of comparators.

In the example in FIG. 4, the controller 325 includes a decoder 420, a multiplexer 430, and an accumulator 440. The multiplexer 430 has multiple inputs (labeled "a" to "h"), in which each input receives a different one of multiple adjustments values. Each of the adjustment values represents a different adjustment to the number of clusters that are turned on in the variable-impedance switch 330. For example, the value of +2 at input c of the multiplexer 340 corresponds to an increase in the number of clusters that are turned on of two, the value of +8 at input d of the multiplexer 340 corresponds to an increase in the number of clusters that are turned on of eight, and so forth. The value of −2 at input b multiplexer 340 corresponds to a decrease in the number of clusters that are turned on of two, and the value of −4 at input a of the multiplexer 340 corresponds to a decrease in the number of clusters that are turned on of four. In general, a negative adjustment value corresponds to a decrease in the number of clusters that are turned on (which increases the impedance of the variable-impedance switch 330), and a positive adjustment value corresponds to an increase in the number of clusters that are turned on (which decreases the impedance of the variable-impedance switch 330). The multiplexer 430 is configured to select one of the adjustment values under the control of the decoder 420, and output the selected adjustment value to the accumulator 440, as discussed further below.

In operation, the decoder 420 receives the voltage code vblk_code from the ADC 320, and selects one of the adjustment values based on the voltage code vblk_code and the target supply voltage. The target supply voltage may correspond to one of the reference voltages v1 to v7 of the ADC 320. For example, the target supply voltage may correspond to the sixth reference voltage v6. In this example, the decoder 420 may determine whether the block supply voltage vblk is above or below the target supply voltage by determining whether the block supply voltage is above or below the sixth reference voltage v6 based on the voltage code vblk_code, and select one of the adjustment values accordingly.

For example, if the voltage code vblk_code of a sample of the block supply voltage vblk indicates that the block supply voltage vblk is above the sixth reference voltage v6 (i.e., the target supply voltage in this example), then the decoder 420 selects one of the negative adjustment values to increase the impedance of the variable-impedance switch 330 based on the voltage code vblk_code. For instance, the decoder 420 selects adjustment value −2 if the voltage code vblk_code is "0111111" (indicating that the block supply voltage vblk is between the sixth reference voltage v6 and the seventh reference voltage v7), and selects adjustment value −4 if the voltage code vblk_code is "1111111" (indicating that the block supply voltage vblk is above the seventh reference voltage v7).

If the voltage code vblk_code of a sample of the block supply voltage vblk indicates that the block supply voltage vblk is below the sixth reference voltage v6 (i.e., the target supply voltage in this example), then the decoder 420 selects one of the positive adjustment values to decrease the impedance of the variable-impedance switch based on the voltage code vblk_code. In this regard, the decoder 420 selects a larger adjustment value if the voltage code vblk_code indicates that the block supply voltage vblk is below the sixth reference voltage v6 by a larger amount. For example, the decoder 420 selects adjustment value +2 if the voltage code vblk_code is "0011111" (indicating that the block supply voltage vblk is between the fifth reference voltage v5 and the sixth reference voltage v6), selects adjustment value +8 if the voltage code vblk_code is "0001111" (indicating that the block supply voltage vblk is between the fourth reference voltage v4 and the fifth reference voltage v5), and so on. FIG. 6 shows a table mapping each one of the different values of the voltage code vblk_code to the corresponding adjustment value for this example.

The decoder 420 instructs the multiplexer 430 to select the selected adjustment value. In response, the multiplexer 430 outputs the selected adjustment value to the accumulator 440. The accumulator 440 adds the selected adjustment value to the impedance code imp_code, which controls the number of clusters that are turned on. Thus, the impedance code imp_code is adjusted by the selected adjustment value. For example, if the selected adjustment value is +8, then the accumulator adds eight to the impedance code imp_code, which increases the impedance code imp_code by eight, and therefore increases the number of clusters that are turned on by eight. In another example, if the selected adjustment value is −2, then the accumulator 440 subtracts two from the impedance code imp_code, which reduces the impedance code imp_code by two, and therefore reduces the number of clusters that are turned on by two.

In the example in FIG. 4, the accumulator 440 includes a summer 442, a limiter 444, and a register 446. The summer 442 is configured to add the selected adjustment value from the multiplexer 430 to the impedance code imp_code to generate an updated impedance code imp_code.

The limiter 444 is configured to limit the updated impedance code imp_code from the summer 442 to a limit value. If the updated impedance code imp_code is below the limit value, then the limiter 444 passes the updated impedance code imp_code from the summer 442 to the register 446. If the updated impedance code imp_code is equal to or above the limit value, then the limiter 444 outputs the limit value to the register 446 as the updated impedance code imp_code. In one example, the limit value may correspond to the number of clusters in the variable-impedance switch 330 to limit the updated impedance code imp_code to the number of clusters in the variable-impedance switch 330. In another example, the limit value may be equal to or below a maximum value of the register 446 to prevent the register 446 from overflowing.

The register 446 is configured to latch the updated impedance code imp_code from the limiter 444 on a rising edge of a clock signal (labeled "clk"), and output the latched updated impedance code imp_code.

In the example in FIG. 4, the clock signal clk is also used to time operations of the ADC 320 and the encoder 460. With regard to the ADC 320, each of the comparators 410-1 to 410-7 in the ADC 320 is configured to compare the respective reference voltage with the block supply voltage vblk on a rising edge of the clock signal clk, and output a logic one or zero based on the comparison. Thus, in this example, the ADC 320 samples the block supply voltage vblk on a rising edge of the clock signal clk, and outputs a voltage code vblk_code based on the sampled block supply voltage vblk to the controller 325. With regard to the encoder 460, the encoder 460 is configured to convert the impedance code imp_code into a thermometer code on a rising edge of the clock signal clk, and output the thermometer code to the clusters 470-1 to 470-n in the variable-impedance switch 330.

In certain aspects, after sampling the block supply voltage vblk, the ADC 320 waits until the impedance of the variable-impedance switch 330 is adjusted based on the sampled block supply voltage vblk before taking the next sample of the block supply voltage vblk. In this way, the next sample reflects the effect the impedance adjustment has on the block supply voltage vblk. This helps keep the loop transfer function of the DSR 310 first order.

In some embodiments, the DSR 310 includes a timing circuit configured to time operations of the ADC 320 so that the ADC 320 waits until the impedance of the variable-impedance switch 330 is adjusted based on a current sample of the block supply voltage vblk before taking the next sample of the block supply voltage vblk. In this regard, FIG.

7 shows an example in which the DSR 310 includes a timing circuit 710 according to certain aspects of the present disclosure. The timing circuit 710 is configured to receive the clock signal clk, and to generate clock signals clk_1, clk_2 and clk_3 based on the clock signal clk.

Clock signal clk_1 is input to the ADC 320 to time sampling of the block supply voltage vblk by the comparators 410-1 to 410-7 in the ADC 320. For example, the comparators 410-1 to 410-7 may sample the block supply voltage vblk on a rising edge of clock signal clk_1.

Clock signal clk_2 is input to the register 446 of the accumulator 440 to time latching of the updated impedance code imp_code by the register 446. For example, the register 446 may latch the updated impedance code imp_code on a rising edge of clock signal clk_2, and output the latched updated impedance code imp_code.

Clock signal clk_3 is input to the encoder 460 to time generation of the thermometer code based on the updated impedance code imp_code from the accumulator 440. For example, the encoder 460 may generate the thermometer code based on the updated impedance code imp_code on a rising edge of clock signal clk_3.

Figure 8:
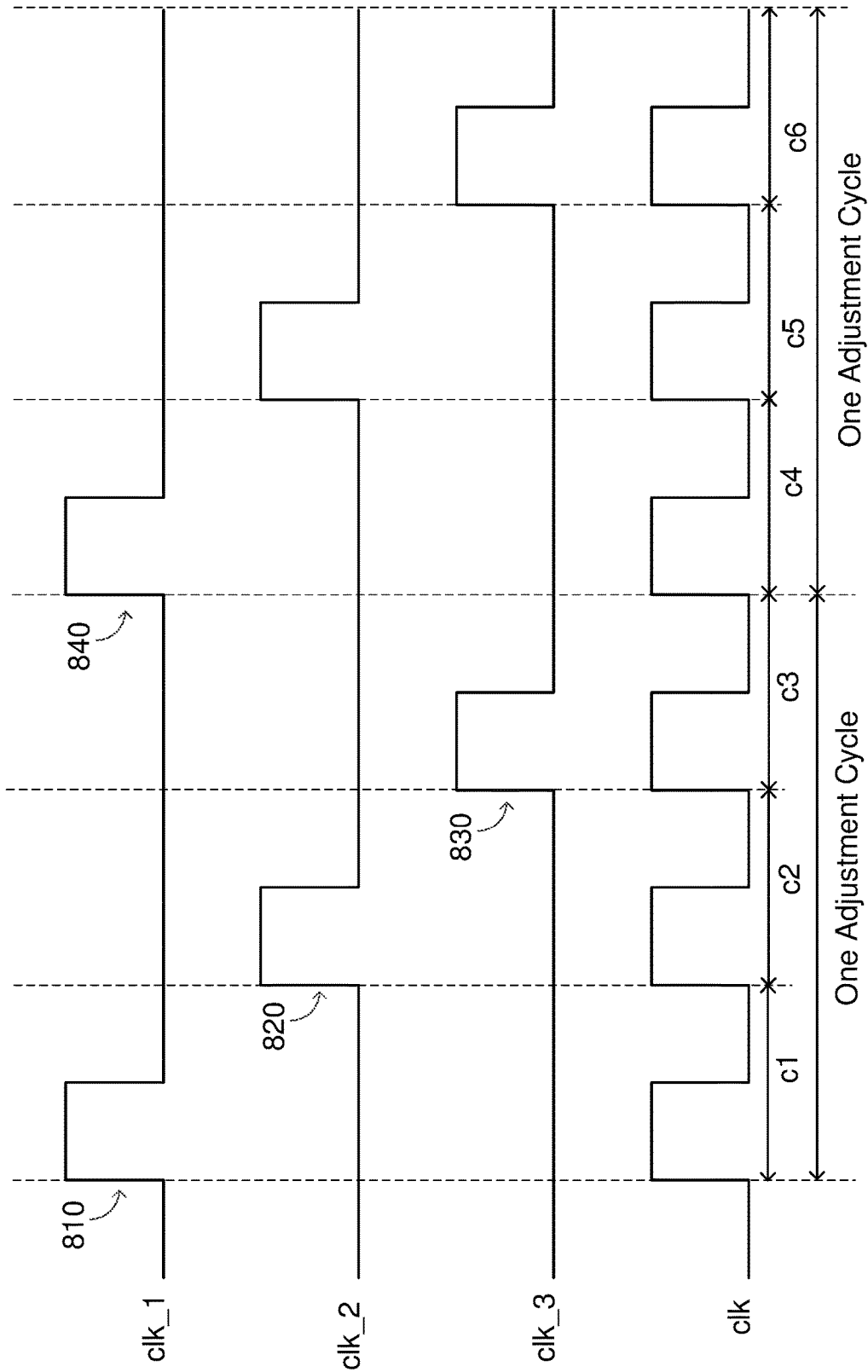
FIG. 8 is a timeline illustrating an example of clock signals used to time operations of the digital sub-regulator according to certain aspects of the present disclosure.

FIG. 8 is a timeline illustrating examples of clock signals clk, clk_1, clk_2 and clk_3.

In this example, for three cycles (periods) of the clock signal clk input to the timing circuit 710, the timing circuit 710 passes a different one of three pulses of the clock signal clk for each one of clock signals clk_1, clk_2 and clk_3. In the example in FIG. 8, the timing circuit 710 passes a first one of the three pulses of the clock signal clk during cycle c1 to generate clock signal clk_1, passes a second one of the three pulses of the clock signal clk during cycle c2 to generate clock signal clk_2, and passes a third one of the three pulses of the clock signal clk during cycle c3 to generate clock signal clk_3.

Thus, in this example, the ADC 320 samples the block supply voltage vblk on the rising edge 810 of the first pulse during cycle c1, and outputs a voltage code vblk_code based on the sampled block supply voltage vblk to the controller 325. The decoder 420 selects one of the adjustment values based on the voltage code vblk_code, the multiplexer 430 outputs the selected adjustment value to the accumulator 440, and the summer 442 of the accumulator 440 updates the impedance code imp_code based on the selected adjustment value to produce an updated impedance code imp_code.

On the rising edge 820 of the second pulse during cycle c2, the register 446 of the accumulator 440 latches the updated impedance code imp_code, and outputs the updated impedance code imp_code. This assumes that the decoder 420, multiplexer 430, summer 442 and limiter 444 operate fast enough for the updated impedance code imp_code to arrive at the input of the register 446 before the rising edge 820 of the second pulse during cycle c2.

On the rising edge 830 of the third pulse during cycle c3, the encoder 460 converts the updated impedance code imp_code into a thermometer code, and outputs the thermometer code to the clusters 470-1 to 470-*n*. The drivers in the clusters drive the pass FETs in the clusters to update the impedance of the variable-impedance switch 330 according to the thermometer code.

The above process is repeated for the next three cycles c4-c6 of the clock signal clk, in which the ADC 320 takes the next sample of the block supply voltage vblk on the rising edge 840 of the pulse in cycle c4 of the clock signal clk. In one example, the pass FETs in the clusters 470-1 to 740-*n* finish updating the impedance of the variable-impedance switch 330 before cycle c4. In this way, the next sample of the block supply voltage vblk taken in cycle c4 reflects the effect the updated impedance has on the block supply voltage, where the updated impedance is based on the sample taken in cycle c1.

In the above example, the impedance of the variable-impedance switch 330 is updated in three cycles of the clock signal clk. In other words, the period between updates (adjustments) of the impedance of the variable-impedance switch 330 is approximately equal to three cycles of the clock signal clk. The period between updates of the impedance of the variable-impedance switch 330 is referred to as an "adjustment cycle" in FIG. 8.

In this example, the response time of the DSR 310 may be deceased by increasing the frequency of the clock signal clk. This is because increasing the frequency of the clock signal clk decreases the cycle time of the clock signal clk (i.e., time of one cycle of the clock signal clk), which decreases the time of each adjustment cycle (three cycles of the clock signal clk in the above example). Decreasing the response time of the DSR 310 allows the DSR 30 to react faster to changes in the block supply voltage vblk.

However, there is a limit to how much the cycle time of the clock signal clk (and hence the adjustment cycle) can be decreased. This is because the cycle time needs to provide sufficient time for various components of the DSR 310 to complete operations for updating the impedance of the variable-impedance switch 330 based on a sampled block supply voltage.

In certain aspects, the time of one adjustment cycle may to decreased to two clock cycles of the clock signal clk to improve the reaction speed of the DSR 310. This may be accomplished by performing accumulation operations for the different adjustment values in parallel, as discussed further below.

Figure 9:
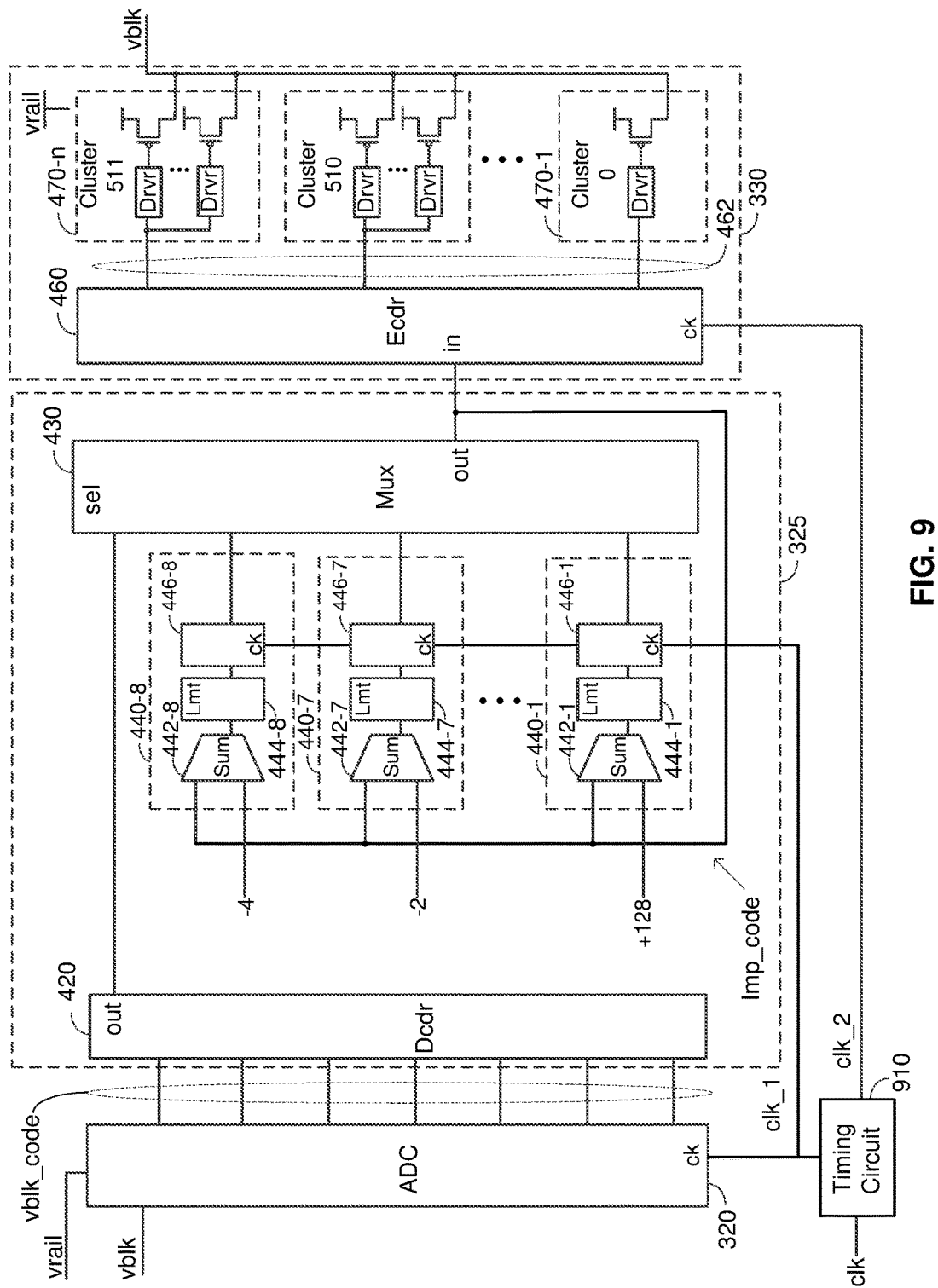
FIG. 9 shows an example of the digital sub-regulator including multiple accumulators according to certain aspects of the present disclosure.

FIG. 9 shows as example in which the controller 325 includes multiple accumulators 440-1 to 440-8 where each of the accumulators 440-1 to 440-8 receives a different one of the adjustment values. In this example, the inputs of the multiplexer 430 are coupled to respective outputs of the accumulators 440-1 to 440-8, and the output of the multiplexer 430 is coupled to the encoder 460.

In operation, each of the accumulators 440-1 to 440-8 updates the impedance code imp_code with the respective adjustment value, and outputs the corresponding updated impedance code imp_code to the multiplexer 430. The multiplexer 430 then selects the updated impedance code imp_code of the accumulator corresponding to the adjustment value selected by the decoder 420. For example, if the decoder 420 selects adjustment value −2, then the multiplexer 430 selects the updated impedance code imp_code of accumulator 440-7. This is because accumulator 440-7 updates the impedance code imp_code with the adjustment value −2. The multiplexer 430 then outputs the selected updated impedance code imp_code to the encoder 460. Thus, in this example, the accumulators generate updated impedance codes for all of the possible adjustment values in parallel, and the multiplexer 430 selects the updated impedance code corresponding to the adjustment value selected by the decoder 420.

Each of the accumulators 440-1 to 440-8 includes a respective summer 442-1 to 442-8, a respective limiter 444-1 to 444-8, and a respective register 446-1 to 446-1. The summer 442-1 to 442-8 of each accumulator 440-1 to 440-8 is configured to add the respective adjustment value to the impedance code from the output of the multiplexer 430 to generate the respective updated impedance code. The limiter 444-1 to 444-8 in each accumulator 440-1 to 440-8 is configured to limit the respective updated impedance code to a limit value. The register 446 in each accumulator 440-1 to 440-8 is configured to latch the respective updated impedance code from the respective limiter 444 on a rising edge of a clock signal, and output the respective latched updated impedance code to the multiplexer 430.

In this example, timing circuit 910 is configured to receive the clock signal clk, and to generate clock signals clk_1 and clk_2 based on the clock signal clk.

Clock signal clk_1 is input to the ADC 320 to time sampling of the block supply voltage vblk by the comparators 410-1 to 410-7 in the ADC 320. For example, the comparators 410-1 to 410-7 may sample the block supply voltage vblk on a rising edge of clock signal clk_1.

Clock signal clk_1 is also input to the register 446-1 to 446-8 of each accumulator 440-1 to 440-8 to time latching of the respective updated impedance code by the register. For example, each register 446-1 to 446-8 may latch the respective updated impedance code on a rising edge of clock signal clk_1, and output the respective latched updated impedance code to the multiplexer 430.

Clock signal clk_2 is input to the encoder 460 to time generation of the thermometer code based on the updated impedance code imp_code from the multiplexer 430. For example, the encoder 460 may generate the thermometer code based on the updated impedance code imp_code on a rising edge of clock signal clk_2.

Figure 10:
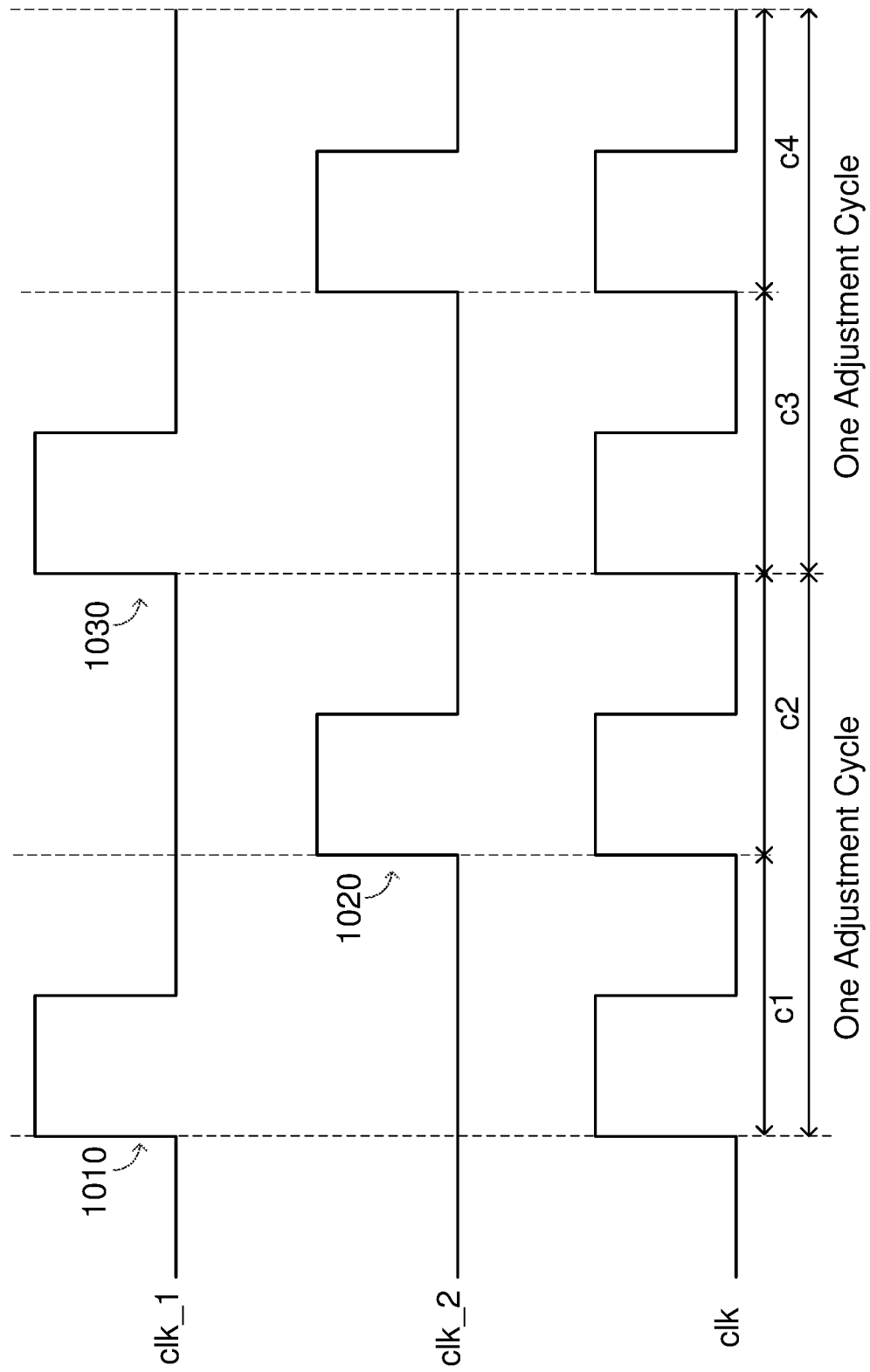
FIG. 10 is a timeline illustrating another example of clock signals used to time operations of the digital sub-regulator according to certain aspects of the present disclosure.

FIG. 10 is a timeline illustrating examples of clock signals clk, clk_1 and clk_2. In this example, for two cycles (periods) of the clock signal clk input to the timing circuit 910, the timing circuit 910 passes a different one of two pulses of the clock signal clk for each one of clock signals clk_1 and clk_2. In the example in FIG. 10, the timing circuit 910 passes a first one of the two pulses of the clock signal clk during cycle c1 to generate clock signal clk_1, and passes a second one of the two pulses of the clock signal clk during cycle c2 to generate clock signal clk_2.

Thus, in this example, the ADC 320 samples the block supply voltage vblk on the rising edge 1010 of the first pulse during cycle c1, and outputs a voltage code vblk_code based on the sampled block supply voltage vblk to the controller 325. In addition, the register 446-1 to 446-7 of each accumulator 440-1 to 440-7 latches the respective updated impedance code imp_code on the rising edge 1010 of the first pulse during cycle c1, and outputs the respective updated impedance code imp_code to the multiplexer 430. This is possible because the accumulators generate updated impedance codes for all of the possible adjustment values ahead of time, and therefore do not need to wait for the decoder 420 to select one of the adjustment values based on the voltage code vblk_code.

During cycle c1, the decoder 420 selects one of the adjustment values based on the sampled voltage code vblk_code, and the multiplexer 430 outputs the updated impedance code from the accumulator corresponding to the selected adjustment value. The multiplexer 430 outputs the updated impedance code to the encoder 460. The multiplexer 430 also outputs the updated impedance code to the summers 442-1 to 442-8 of the accumulators 440-1 to 440-8 so that the summers can generate the updated impedance codes for the next adjustment cycle. The accumulators may generate the updated impedance code for the next adjustment cycle before the sample of the block supply voltage vblk for the next adjustment cycle is taken.

On the rising edge 1020 of the second pulse during cycle c2, the encoder 460 converts the updated impedance code imp_code into a thermometer code, and outputs the thermometer code to the clusters 470-1 to 470-n. The drivers in the clusters drive the pass FETs in the clusters to update the impedance of the variable-impedance switch 330 according to the thermometer code.

The above process is repeated for the next two cycles c3 and c4 of the clock signal clk, in which the ADC 320 takes the next sample of the block supply voltage vblk on the rising edge 1030 of the pulse in cycle c3.

In the above example, the impedance of the variable-impedance switch 330 is updated in two cycles of the clock signal clk. Thus, the adjustment cycle of the DSR 310 in this example is approximately equal to two cycles of the clock signal clk instead of three cycles of the clock signal clk in the previous example. In other words, the adjustment cycle of the DSR 310 is reduced from three cycles of the clock signal clk to two cycle of the clock signal clk. The reduction in the adjustment cycle improves the ability of the DSR 310 to response to load current transients.

As discussed above, the reference voltages v1 to v7 of the ADC 320 may be generated by a resistor ladder including multiple resistors (e.g., resistors r1 to r8) coupled in series between the supply rail 305 and ground. In this example, the reference voltages v1 to v7 depend on the supply voltage vrail on the supply rail 305. More particularly, the reference voltages v1 to v7 are different fractions of the supply voltage vrail, in which the fractions depend on the resistance values of the resistors r1 to r8.

Figure 11:
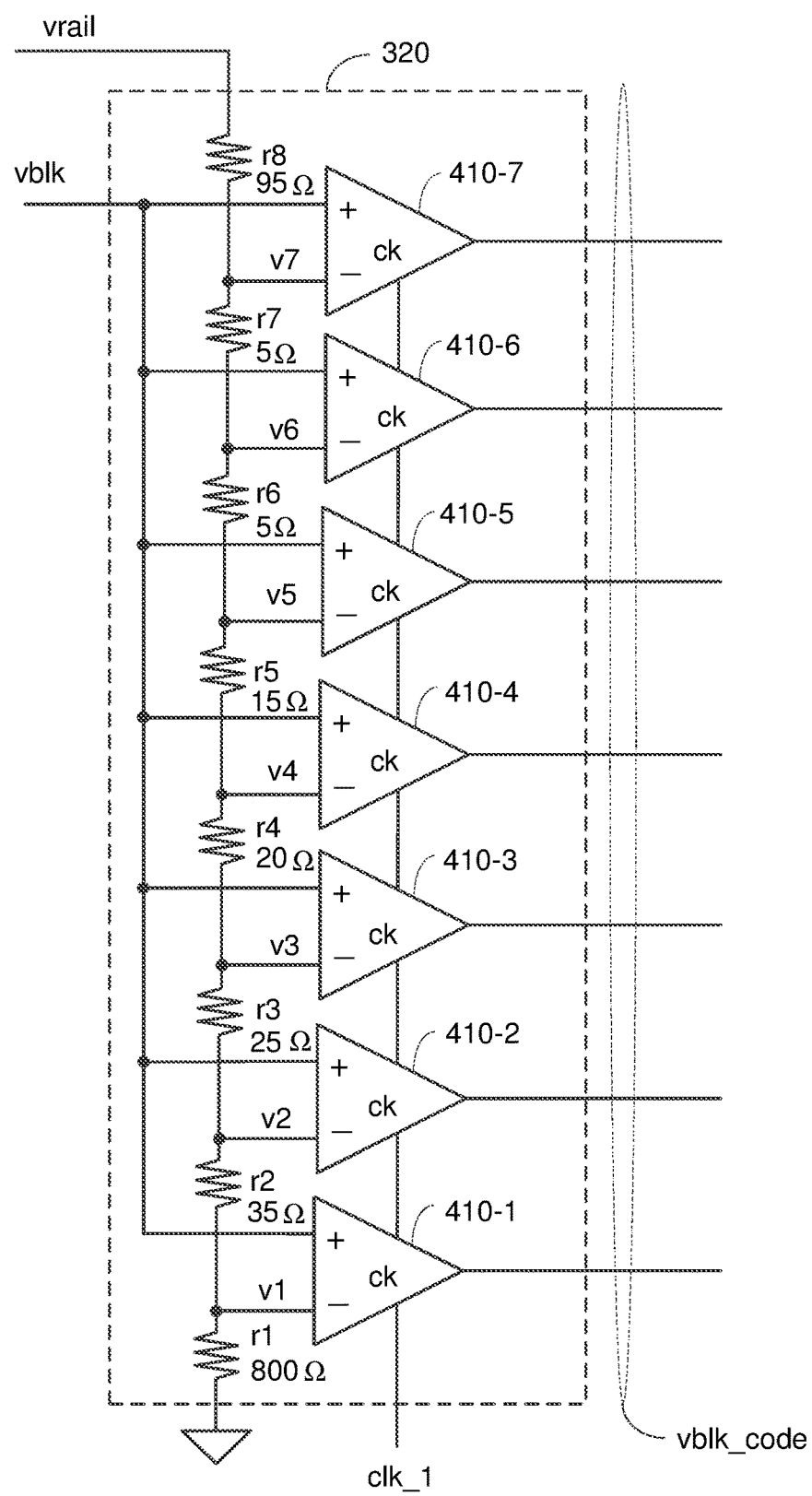
FIG. 11 shows exemplary resistance values for resistors in a resistor ladder according to certain aspects of the present disclosure.

In this regard, FIG. 11 shows an example of resistance values for resistors r1 to r8. In this example, the total resistance of the resistor ladder (i.e., sum of the resistance values of the resistors r1 to r8) is approximately equal to moon. For the exemplary resistance values shown in FIG. 11, the first reference voltage v1 equals 0.80*vrail, the second reference voltage v2 equals 0.835*vrail, the third reference voltage v3 equals 0.86*vrail, the fourth reference voltage v4 equals 0.88*vrail, the fifth reference voltage v5 equals 0.895*vrail, the sixth reference voltage v6 equals 0.90*vrail, and the seventh reference voltage v7 equals 0.905*vrail. For the case in which the target supply voltage corresponds to the sixth reference voltage v6, the target supply voltage is approximately equal to 0.90*vrail in this example. Thus, in this example, the DSR 310 adjusts the impedance of the variable-impedance switch 330 to maintain the block supply voltage vblk close to 0.90*vrail under changing load conditions.

In this example, the spacing between adjacent reference voltages is smaller near the target supply voltage (the sixth reference voltage v6 in this example). This is done to provide higher resolution (smaller quantization steps) near the target supply voltage.

Since the target supply voltage corresponds to one of the reference voltages (e.g., the sixth reference voltage), the target supply voltage is a fraction of the supply voltage vrail (e.g., 0.90*vrail). In other words, the target supply voltage is proportional to the supply voltage vrail. More particularly, the target supply voltage is approximately equal to p*vrail, where p is a proportionality factor and is equal to 0.90 in the example shown in FIG. 11.

When the DSR 310 tries to pull up the block supply voltage vblk by decreasing the impedance of the variable-impedance switch 330, the supply voltage vrail may temporarily decrease due to series inductance in the power distribution network (PDN) that provides the supply voltage vrail. If the target supply voltage were a fixed voltage independent of the supply voltage vrail, then it may be possible for the supply voltage vrail to fall below the target supply voltage. In this case, the DSR 310 would be unable to pull the block supply voltage blk to the target supply voltage even if the DSR 310 turns on all of the clusters 470-1 to 470-n in the variable-impedance switch 330, which may cause instability of the block supply voltage blk. This situation is avoided by making the target supply voltage proportional to the supply voltage vrail (e.g., 0.90*vrail), as discussed above.

A large voltage droop in the block supply voltage vblk may occur when the block supply voltage vblk drops by a large amount due to a sudden increase in the current load of the respective circuit block 315. If the DSR 310 fails to respond quickly to the voltage droop, then the voltage droop may cause the block supply voltage vblk to drop below the minimum voltage needed for critical paths in the respective block 315 to meet certain timing requirements (e.g., setup time requirements), causing the respective block 315 to malfunction. To address this, the controller 325 may be configured to respond aggressively to large voltage droops in the block supply voltage vblk, as discussed further below.

In the discussion below, the magnitude of a voltage droop in the block supply voltage vblk is approximately equal to the target supply voltage (e.g., sixth reference voltage v6) minus the block supply voltage vblk. The larger the amount the block supply voltage vblk drops (falls) below the target supply voltage, the larger the magnitude of the voltage droop.

In certain aspects, the reference voltages v1 to v6 define magnitude ranges for a voltage droop. For example, using the example shown in FIG. 11, the sixth reference voltage v6 and the fifth reference voltage v5 defined a first magnitude range of zero to 0.005*vrail (i.e., 0.90*vrail minus 0.895*vrail). A voltage droop having a magnitude of less than 0.005*vrail is located in the first magnitude range, and results in a voltage code vblk_code of 0011111. The fifth reference voltage v5 and the fourth reference voltage v4 define a second magnitude range of 0.005*vrail to 0.02*vrail (i.e., 0.90*vrail minus 0.88*vrail). A voltage droop having a magnitude between 0.005*vrail and 0.02*vrail is located in the second magnitude range, and results in a voltage code vblk_code of 0001111. The fourth reference voltage v4 and the third reference voltage v3 define a third magnitude range of 0.02*vrail to 0.04*vrail (i.e., 0.90*vrail minus 0.86*vrail). A voltage droop having a magnitude between 0.02*vrail and 0.04*vrail is located in the third magnitude range, and results in a voltage code vblk_code of 0000111. The third reference voltage v3 and the second reference voltage v2 define a fourth magnitude range of 0.04*vrail to 0.065*vrail (i.e., 0.90*vrail minus 0.835*vrail). A voltage droop having a magnitude between 0.04*vrail to 0.065*vrail is located in the fourth magnitude range, and results in a voltage code vblk_code of 0000011. The second reference voltage v2 and the first reference voltage v1 define a fifth magnitude range of 0.065*vrail to 0.10*vrail (i.e., 0.90*vrail minus 0.80*vrail). A voltage droop having a magnitude between 0.065*vrail and 0.10*vrail is located in the fifth magnitude range, and results in a voltage code vblk_code of 0000001. Finally, the first reference voltage v1 defines a sixth magnitude range above 0.10*vrail. A voltage droop having a magnitude above 0.10*vrail is located in this range and results in a voltage code vblk_code of 0000000.

In this example, the second magnitude range is higher than the first magnitude range (i.e., the voltages in the second magnitude range are higher than the voltages in the first magnitude range). Similarly, the third magnitude range is higher than the second magnitude range, the fourth magnitude range is higher than the third magnitude range, and so on.

In this example, when the magnitude of a voltage droop is in the first magnitude range, the controller 325 selects adjustment value +2 (increases the number of clusters turned on by two). In this case, the voltage code vblk_code is 0011111. When the magnitude of a voltage droop is in the second magnitude range, the decoder 420 selects adjustment value +8. In this case, the voltage code vblk_code is 0001111. When the magnitude of a voltage droop is in the third magnitude range, the decoder 420 selects adjustment value +16. In this case, the voltage code vblk_code is 0000111. When the magnitude of a voltage droop is in the fourth magnitude range, the decoder 420 selects adjustment value +32. In this case, the voltage code vblk_code is 0000011. When the magnitude of a voltage droop is in the fifth magnitude range, the decoder 420 selects adjustment value +64. In this case, the voltage code vblk_code is 0000001. Finally, when the magnitude of a voltage droop is in the sixth magnitude range (i.e., above 0.10*vrail in the above example), the decoder 420 selects adjustment value +128. In this case, the voltage code vblk_code is 0000000.

Thus, when the ADC 320 samples the block supply voltage vblk during a voltage droop, the controller 325 decreases the impedance of the variable-impedance switch 330 to mitigate the droop based on the magnitude of the droop indicted by the corresponding voltage code vblk_code. For example, if the voltage code vblk_code indicates a moderate droop (e.g., magnitude of the voltage droop is in the second magnitude range), then the controller 325 may increase the number of clusters that are turned on by eight. If the voltage code vblk_code indicates a large droop (e.g., magnitude of voltage droop is in the sixth magnitude range), then the controller 325 aggressively responds to the droop by increasing the number of clusters that are turned on by 128.

In certain aspects, the controller 325 adjusts the impedance code by a first amount if the magnitude of a voltage droop is in a first one of a plurality of magnitude ranges, and adjusts the impedance code by a second amount if the magnitude of the voltage droop is in a second one of the plurality of magnitude ranges, wherein the second one of the plurality of magnitude ranges is higher than the first one of the plurality of magnitude ranges, and a magnitude of the second amount is larger than a magnitude of the first amount. The magnitude of the second amount may be at least twice the magnitude of the first amount. For example, using the above example, if the magnitude of a voltage droop is in the second magnitude range, then the controller 325 adjusts the impedance code by 8. If the magnitude of the voltage droop is in the third magnitude range, then the controller 325 adjusts the impedance code by 16. In another example, if the magnitude of a voltage droop is in the fourth magnitude range, then the controller 325 adjusts the impedance code by 32. If the magnitude of the voltage droop is in the fifth magnitude range, then the controller 325 adjusts the impedance code by 64.

The supply rail 305 receives power from a power source (e.g., a power management integrated circuit (PMIC)) via a power distribution network (PDN). The PDN typically includes inductance (e.g., package inductance). The inductance of the PDN and the capacitance of the circuit block 315 form a resonance network with a specific resonance period. For stability, it is desirable to avoid exciting the resonance of the resonance network, which can result in large oscillations in the supply voltage vrail. As discussed further below, the DSR 310 reduces excitation of the resonance of the network by having a slow response to large voltage overshoot compared with the resonance period, as discussed further below.

A voltage overshoot occurs when the block supply voltage vblk rises above the target supply voltage (e.g., the sixth reference voltage v6). During an overshoot, the decoder 420 selects one of the negative adjustment values (e.g., −2 or −4) to increase the impedance of the variable-impedance switch 330 based on the voltage code vblk_code of a sample of the block supply voltage vblk.

In order to effectively mitigate voltage droop, the DSR 310 responds to the droop with a response time that is less than the resonance period of the resonance network. This may be accomplished by making the adjustment cycle (period) of the DSR 310 less than the resonance period of the resonance network. In this way, the DSR 310 is able to decrease the impedance of the variable-impedance switch 330 by a relatively large amount (e.g., an amount corresponding to an adjustment value of +32, +64 or +128) in response to the droop in less time than the resonance period of the resonance network. Thus, in this example, the DSR 310 responds quickly to a large voltage droop.

If the DSR 310 also responds to a large overshoot in the block supply voltage vblk in less time than the resonance period, then the DSR 310 effectively adds energy to the resonance network, causing the resonance network to oscillate. To reduce oscillation of the resonance network, the DSR 310 may be intentionally configured to have a response to a large overshoot that is slower than the resonance period according to certain aspects. This approach results in the block supply voltage vblk staying above the target supply voltage by a larger amount for a longer time duration, which may lead to a small increase in power consumption compared with an approach having a fast response to large overshoot. Thus, a little extra power is consumed in exchange for more stability. In the discussion below, the magnitude of a voltage overshoot is approximately equal to the block supply voltage vblk minus the target supply voltage (e.g., sixth reference voltage v6).

Figure 7:
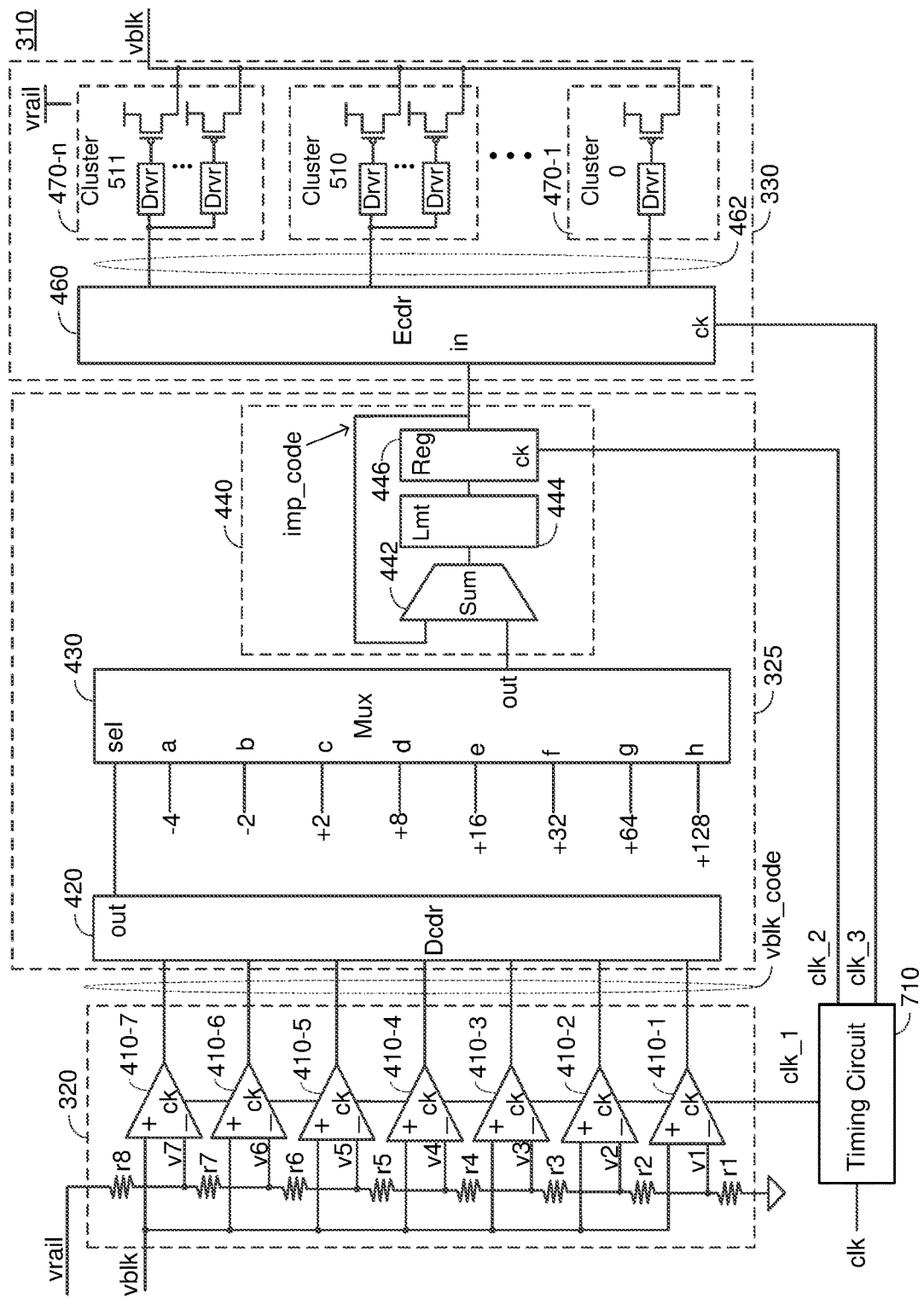
FIG. 7 shows an example of the digital sub-regulator including a timing circuit for timing operations of the digital sub-regulator according to certain aspects of the present disclosure.

In the examples in FIGS. 4 and 7, the controller 325 decreases the number of clusters 470-1 to 470-n that are turned on in small steps in response to a large overshoot. More particularly, using the above example, the controller 325 decreases the number of clusters 470-1 to 470-n that are turned on by four in each adjustment cycle in response to a large overshoot (e.g., a voltage overshoot having a magnitude exceeding 0.02*vrail).

In contrast, in response to a large voltage droop (e.g., a voltage droop having a magnitude exceeding 0.02*vrail), the controller 325 increases the number of clusters that are turned on by 16 or more in each adjustment cycle. As a result, the controller 325 is able to adjust the impedance of the variable-impedance switch 330 by a much larger amount per adjustment cycle for a large voltage droop compared with a large overshoot, and therefore respond much faster to a large voltage droop than a large overshoot.

For example, if a voltage droop has a magnitude of 0.07*vrail, then the controller 325 increases the number of clusters that are turned on by 64 in one adjustment cycle. In contrast, if a voltage overshoot has the same magnitude of 0.07*vrail, then the controller 325 decreases the number of clusters that are turned on by four in one adjustment cycle. Thus, in this example, controller 325 takes 16 adjustment cycles to decrease the number of clusters that are turned on by 64, while it takes just one adjustment cycle for the controller 325 to increase the number of clusters that are turned on by 64 in response to a voltage droop of the same magnitude.

In certain aspects, the controller 325 adjusts the impedance code by a first amount within a period of time (e.g., adjustment cycle) in response to a voltage droop on the block supply voltage vblk, and adjusts the impedance code by a second amount within the period of time (e.g., adjustment cycle) in response to a voltage overshoot on the block supply voltage, wherein a magnitude of the first amount is larger than a magnitude of the second amount, and the voltage droop and the voltage overshoot have approximately a same magnitude. In one example, the magnitude of the first amount is at least four times larger than the magnitude of the second amount. In another example, the magnitude of the first amount is at least ten time larger than the magnitude of the second amount. For example, using the above example, for a voltage droop having a magnitude of 0.7*vrail, the controller 325 increases the impedance code by 64 in the period of time (adjustment cycle). For a voltage overshoot having the same magnitude of 0.07*vrail, the controller 325 decreases the impedance code by four in the period of time (adjustment cycle). In this example, the magnitude of the adjustment amount for the voltage droop is 64 and the magnitude of the adjustment amount for the voltage overshoot is 4.

As shown in FIGS. 4 and 7, the pass FETs in the variable-impedance switch 330 are divided into clusters 470-1 to 470-n. In certain aspects, each cluster is weighted such that, regardless of how many clusters are enabled (turned on), turning on or off one cluster changes the impedance of the variable-impedance switch 330 by approximately a fixed percentage (e.g., 2%). For example, referring to the example in FIG. 4, if clusters 0 to 200 are turned on, then turning on cluster 201 decreases the impedance by approximately the fixed percentage. If clusters 0 to 300 are turned on, then turning on cluster 301 decreases the impedance by approximately the fixed percentage. In general, turning on one cluster decreases the impedance by approximately the fixed percentage, and turning off one cluster increases the impedance by approximately the fixed percentage.

The clusters may be weighted, for example, by distributing the pass FETs among the clusters to achieve the desired weight. In this example, the number of pass FETs exceeds the number of clusters.

This weighting allows the response of the DSR 310 to be approximately independent of the load current. For example, suppose a voltage of vdelta equal to the difference between the supply voltage vrail and the target supply voltage. In this example, if the block supply voltage vblk voltage is below the target supply voltage by 10% of vdelta, then the controller 325 may decreased the impedance of the variable-impedance switch 330 by 10% to correct the block supply voltage vblk by increasing the number of clusters that are turned on by 10% divided by the fixed percentage. If the PDN were strictly resistive, this one correction would be all that was needed to correct the block supply voltage vblk.

When the DSR 310 tries to raise the block supply vblk by decreasing the impedance of the variable-impedance switch 300, the supply voltage vrail on the supply rail 305 may get pulled down because of the series inductance in the PDN that acts like a high impedance. However, since the inductance is typically small, the supply voltage vrail is quickly pulled up. This effect is referred to as an inductive transient.

To increase the sampling frequency of the DSR 310, it is desirable for the ADC 320 to sample the block supply voltage vblk right after the impedance of the variable-impedance switch 330 has changed based on the previous sample of the block supply voltage vblk. However, this may result in sampling the block supply voltage vblk when the supply voltage vrail is temporarily too low due to the inductive transient. Since the reference voltages are proportional to the supply voltage vrail in the examples in FIGS. 4 and 7, the temporary reduction in the supply voltage vrail due to the inductive transient may cause a temporary reduction in the reference voltages. This, in turn, may cause the corresponding voltage code vblk_code to be higher than it would have been without the inductive transient.

To avoid sampling when the supply voltage vrail is temporarily too low, the block supply voltage vblk may be sampled after the supply voltage vrail has recovered from the inductive transient. However, this reduces the sampling frequency of the DSR 310.

In order to increase the sampling frequency while reducing the effects of the inductive transient, the controller 325 may perform the following operations according to certain aspects. If the impedance of the variable-impedance switch is decreased by a substantial amount in a given adjustment cycle, then the decoder 420 may digitally shift the voltage code vblk_code from the ADC 320 on the next adjustment cycle to compensate for the inductive transient. The shift may result in a voltage code that approximately matches the voltage code that would have been generated had the block supply voltage vblk been sampled after the inductive transient.

For example, the decoder 420 may determine that the impedance of the variable-impedance switch is decreased by a substantial amount when the voltage code vblk_code is equal to or below a certain value (e.g., 0001111 or lower) indicating that a large adjustment value equal to or above a threshold is selected. In this case, the decoder 420 may set a flag indicating that that the next sample of the block supply voltage vblk should be compensated for inductive transient.

When the ADC 320 samples the block supply voltage vblk on the next adjustment cycle, the flag causes the decoder 420 to digitally shift the corresponding voltage code vblk_code to compensate for the inductive transient. For example, the decoder 420 may shift the voltage code vblk_code downward by one. For instance, if the voltage code vblk_code is 0011111, then the decoder 420 may shift the voltage code to 0001111 in this example. The decoder 420 may then use the shifted (compensated) voltage code to select an adjustment value for the impedance code. Shifting the voltage code vblk_code downward compensates for the inductive transient since the inductive transient causes the voltage code to be higher than it would have been without the inductive transient, as discussed above.

In certain aspects, the DSR 310 may operate in a fully-turned on mode in which all of the clusters 470-1 to 470-n are turned on. In this mode, the block supply voltage vblk is approximately equal to the supply voltage vrail. For example, the DSR 310 may be placed in this mode when the respective circuit block 315 is operating at a high clock frequency requiring operation at the supply voltage vrail on the rail 305. In this mode, the encoder 460 may turn on all of the clusters regardless of the impedance code. When the DSR 310 is not in the fully-turned on mode, the DSR 310 may regulate the block supply voltage vblk based on the target supply voltage, as discussed above. This may be done, for example, when the respective circuit block 310 is operating at a lower clock frequency that allows the respective circuit block 310 to operate at a supply voltage that is lower than the supply voltage vrail on the rail 305 to reduce power consumption. In these aspects, the DSR 310 may receive a control signal that controls whether the DSR 310 is to operate in the fully-turned on mode.

Figure 12:
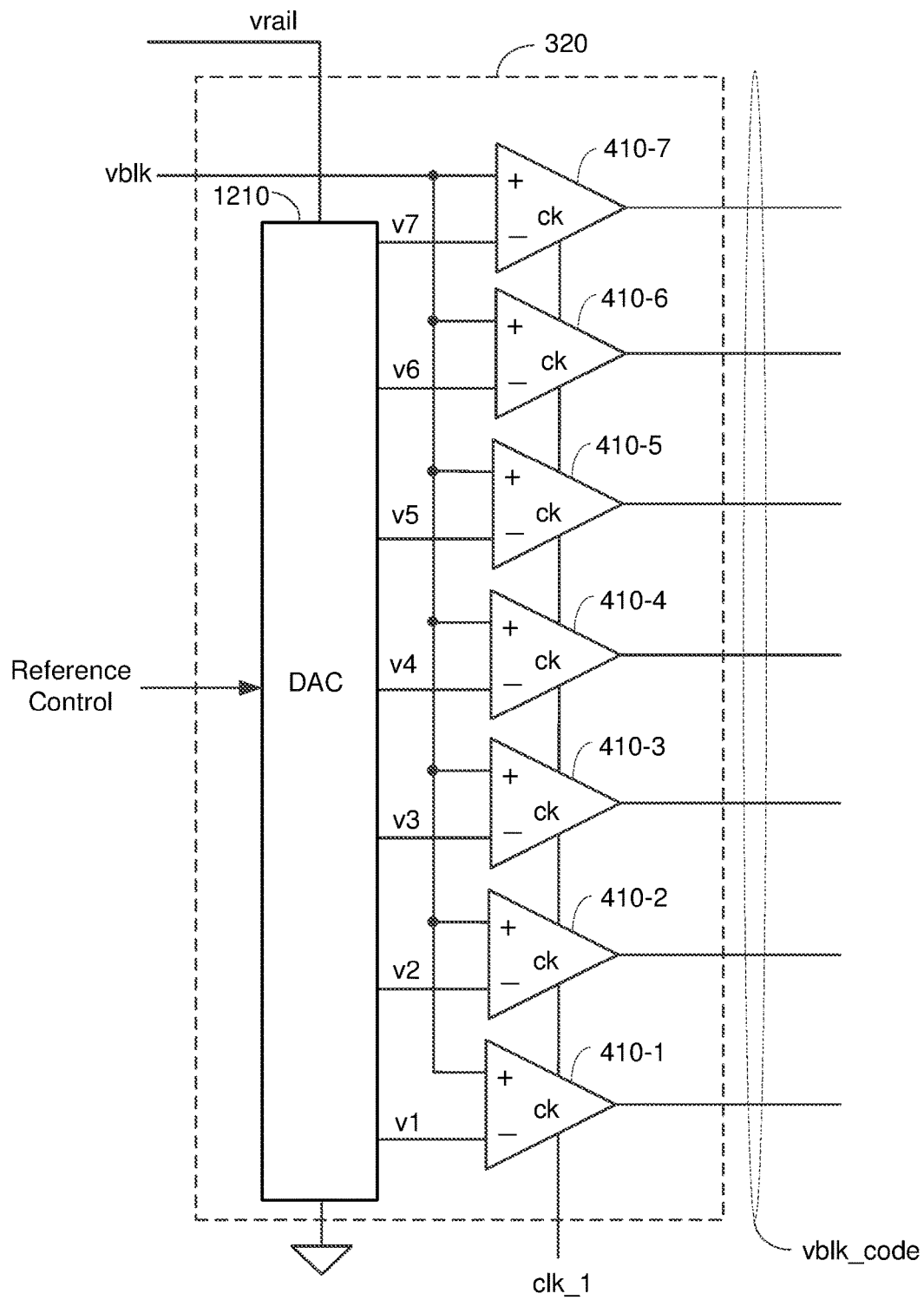
FIG. 12 shows an example of a digital-to-analog (DAC) configured to generate reference voltages according to certain aspects of the present disclosure.

FIG. 12 shows an example in which the ADC 320 includes a digital-to-analog converter (DAC) 1210 for generating the reference voltages v1 to v7. In this example, the DAC 1210 is powered by the supply voltage vrail on the supply rail. The DAC 1210 is configured to receive a digital reference control signal, and to set the reference voltages v1 to v7 based on the reference control signal. Each reference voltage is a different fraction of the supply voltage vrail. In other words, each reference voltage is proportional to the supply voltage vrail by a different proportionality factor (ratio). In this example, the reference control signal sets the proportionality factors of the reference voltages v1 to v7.

The DAC 1210 allows a power manager (not shown) to change the proportionality factors of the reference voltages v1 to v7 by changing the reference control signal accordingly. For example, the power manager may change the target supply voltage based on the clock frequency of the circuit block 310, as discussed above. In this example, the power manager may change the settings of the reference voltages v1 and v7 so that the sixth reference voltage v6 is set to the new target supply voltage (e.g., 0.75*vrail or another ratio). The reference voltages v1 to v5 may be set according to desired magnitude ranges for responding to voltage droop.

Figure 13:
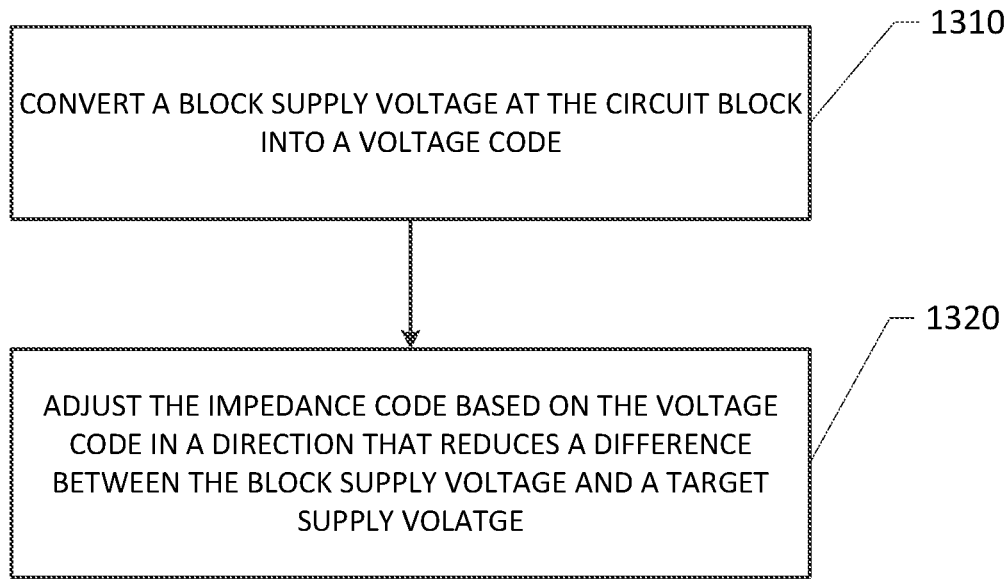
FIG. 13 is a flowchart illustrating a method for voltage regulation according to certain aspects of the present disclosure.

FIG. 13 is a flowchart illustrating a method 1300 for adjusting an impedance of a variable-impedance switch (e.g., variable impedance switch 330) according to certain aspects of the present disclosure. The variable-impedance switch is coupled between a supply rail (e.g., supply rail 305) and a circuit block (circuit block 315), and an impedance of the variable-impedance switch is set by an impedance code input to the variable-impedance switch.

At step 1310, a block supply voltage at the circuit block is converted into a voltage code. For example, block supply voltage (e.g., vblk) may be converted into the voltage code (e.g., vblk_code) by an ADC (e.g., ADC 320).

At step 1320, the impedance code is adjusted based on the voltage code in a direction that reduces a difference between the block supply voltage and a target supply voltage. For example, the impedance code may be adjusted to decrease the impedance of the variable-impedance switch if the voltage code indicates that the block supply voltage is below the target supply voltage. The impedance code may be adjusted to increase the impedance of the variable-impedance switch if the voltage code indicates that the block supply voltage is above the target supply voltage.

It is to be understood that embodiments of the present disclosure are not limited to the examples given above. For example, although the ADC 320 samples the block supply voltage vblk on the rising edges of a clock signal in the examples given above, it is to be understood that the ADC 320 may instead sample the block supply voltage vblk on falling edges of a clock signal. In general, the ADC 320 samples the block supply voltage vblk on active edges of the clock signal, which may be rising and/or falling edges. Also, it is be appreciated that embodiments of the present disclosure are not limited to the exemplary reference voltages and resistance values given above, and may have different reference voltages and/or resistance values (e.g., depending on a desired target supply voltage, desired quantization step sizes for the ADC, etc.). Also, it is to be appreciated that the decoder 420 is not limited to shifting a voltage code by one to compensate for inductive transient, and may shift the voltage by a different amount (e.g., two) depending on the impact of the inductive transient on the voltage code.

The controller 325 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two components. The term "circuit" is used broadly, and intended to cover hardware implementations of electrical devices and conductors that, when connected and configured, enable the performance of the functions described in the present disclosure. The term "circuit" is also intended to cover software implementations, in which a processor performs the functions described herein by executing software comprising code for performing the functions. The software may be stored on a computer-readable storage medium, such as a RAM, a ROM, an EEPROM, an optical disk, and/or a magnetic disk.

It is to be understood that present disclosure is not limited to the specific order or hierarchy of steps in the methods disclosed herein. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A regulator, comprising:
   a variable-impedance switch coupled between a supply rail and a circuit block, wherein an impedance of the variable-impedance switch is set by an impedance code input to the variable-impedance switch;
   an analog-to-digital converter (ADC) configured to convert a block supply voltage at the circuit block into a voltage code; and
   a controller configured to adjust the impedance code based on the voltage code in a direction that reduces a difference between the block supply voltage and a target supply voltage;
   wherein the controller is configured to adjust the impedance code by a first amount within a period of time in response to a voltage droop on the block supply voltage, and to adjust the impedance code by a second amount within the period of time in response to a voltage overshoot on the block supply voltage, wherein a magnitude of the first amount is larger than a magnitude of the second amount, and the voltage droop and the voltage overshoot have approximately a same magnitude.

2. The regulator of claim 1, wherein the controller comprises:
   a multiplexer configured to receive a plurality of adjustment values;
   a decoder configured to select one of the plurality of adjustment values based on the voltage code, wherein the multiplexer is further configured to output the selected one of the plurality of adjustment values at an output of the multiplexer; and
   an accumulator coupled to the output of the multiplexer, wherein the accumulator is configured to adjust the impedance code based on the selected one of the plurality of adjustment values.

3. The regulator of claim 2, wherein the accumulator is configured to adjust the impedance code based on the selected one of the plurality of adjustment values by adding the selected one of the plurality of adjustment values to the impedance code.

4. The regulator of claim 1, wherein the controller comprises:
   a plurality of accumulators, wherein each one of the plurality of accumulators is configured to adjust the impedance code based on a respective one of a plurality of adjustment values to generate a respective updated impedance code;
   a multiplexer configured to receive the updated impedance codes from the plurality of accumulators; and
   a decoder configured to select one of the plurality of adjustment values based on the voltage code;
   wherein the multiplexer is further configured to select one of the updated impedance codes based on the selected one of the plurality of adjustment values, and to output the selected one of the updated impedance codes to the variable-impedance switch.

5. The regulator of claim 1, wherein the target supply voltage is proportional to a supply voltage on the supply rail.

6. The regulator of claim 5, wherein the ADC comprises:
   a reference generation circuit configured to generate a plurality of reference voltages, wherein each one of the plurality of reference voltages is a different fraction of the supply voltage on the supply rail; and
   a plurality of comparators, wherein each one of the plurality of comparators is configured to compare a respective one of the reference voltages with the block supply voltage, and to generate a respective bit of the voltage code based on the comparison;
   wherein the target supply voltage corresponds to one of the reference voltages.

7. The regulator of claim 1, wherein the variable-impedance switch comprises a plurality of clusters, each one of the plurality of clusters comprises respective one or more pass transistors coupled between supply rail and the circuit block, and the impedance code controls a number of the plurality of clusters that are turned on.

8. The regulator of claim 7, wherein the plurality of clusters is weighted such that turning on one of the plurality of clusters changes the impedance of the variable-impedance switch by an approximately fixed percentage regardless of a number of the plurality of clusters that are already turned on.

9. The regulator of claim 1, wherein the controller is configured to determine in which one of a plurality of magnitude ranges the magnitude of the voltage droop on the block supply voltage is located based on the voltage code, and to adjust the impedance code based on the determined one of the plurality of magnitude ranges.

10. The regulator of claim 1, wherein the magnitude of the first amount is at least four times larger than the magnitude of the second amount.

11. The regulator of claim 1, wherein the controller is configured to shift the voltage code if a previous adjustment to the impedance of the variable-impedance switch is greater than a threshold, and to adjust the impedance code based on the shifted voltage code.

12. The method of claim 1, wherein the supply rail is coupled to a power distribution network, and the period of time is less than a resonance period of a resonance network formed by an inductance of the power distribution network and a capacitance of the circuit block.

13. A method for adjusting an impedance of a variable-impedance switch, wherein the variable-impedance switch is coupled between a supply rail and a circuit block, and an impedance of the variable-impedance switch is set by an impedance code input to the variable-impedance switch, the method comprising:
   converting a block supply voltage at the circuit block into a voltage code; and
   adjusting the impedance code based on the voltage code in a direction that reduces a difference between the block supply voltage and a target supply voltage;
   wherein adjusting the impedance code based on the voltage code further comprises:
      adjusting the impedance code by a first amount within a period of time in response to a voltage droop on the block supply voltage; and
      adjusting the impedance code by a second amount within the period of time in response to a voltage overshoot on the block supply voltage;
   wherein a magnitude of the first amount is larger than a magnitude of the second amount, and the voltage droop and the voltage overshoot have approximately a same magnitude.

14. The method of claim 13, wherein adjusting the impedance code based on the voltage code further comprises:
   selecting one of the plurality of adjustment values based on the voltage code; and
   adjusting the impedance code based on the selected one of the plurality of adjustment values.

15. The method of claim 13, wherein adjusting the impedance code based on the voltage code further comprises:
   for each one of a plurality of adjustment values, adjusting the impedance code by the respective adjustment value to generate a respective updated impedance code; and
   selecting one of the updated impedance codes based on the voltage code.

16. The method of claim 13, wherein the target supply voltage is proportional to a supply voltage on the supply rail.

17. The method of claim 13, wherein adjusting the impedance code based on the voltage code further comprises:
   determining in which one of a plurality of magnitude ranges the magnitude of the voltage droop on the block supply voltage is located based on the voltage code; and
   adjusting the impedance code based on the determined one of the plurality of magnitude ranges.

18. The method of claim 13, wherein the magnitude of the first amount is at least four times larger than the magnitude of the second amount.

19. The method of claim 13, further comprising shifting the voltage code if a previous adjustment to the impedance of the variable-impedance switch is greater than a threshold, wherein adjusting the impedance code is based on the shifted voltage code.

* * * * *